United States Patent [19]

Matuo

[11] Patent Number: 4,988,403
[45] Date of Patent: Jan. 29, 1991

[54] METHOD OF FORMING PATTERNED SILICONE RUBBER LAYER

[75] Inventor: Kozo Matuo, Kyoto, Japan

[73] Assignee: Rohm Co., Ltd., Kyoto, Japan

[21] Appl. No.: 452,360

[22] Filed: Dec. 19, 1989

[30] Foreign Application Priority Data

Dec. 21, 1988 [JP] Japan ................... 63-324492

[51] Int. Cl.⁵ ............... H01L 21/308; H01L 21/31
[52] U.S. Cl. ....................... 156/643; 156/653; 156/657; 437/228; 437/231; 437/241
[58] Field of Search .............. 156/632, 643, 653, 662, 156/668, 657, 904; 437/228, 231, 241

[56] References Cited

U.S. PATENT DOCUMENTS

| | | | |
|---|---|---|---|
| 3,833,436 | 9/1974 | Hillis et al. | 156/668 |
| 4,119,483 | 10/1978 | Hubsch et al. | 156/668 |
| 4,218,283 | 8/1980 | Saiki et al. | 156/668 |
| 4,399,016 | 8/1983 | Tsukada et al. | 156/643 |
| 4,586,976 | 5/1988 | Takano et al. | 156/240 |
| 4,677,036 | 6/1987 | Nakamura et al. | 156/663 |

FOREIGN PATENT DOCUMENTS 61-222179 10/1986 Japan .

OTHER PUBLICATIONS

Greschner et al., IBM Technical Disclosure Bulletin, vol. 25, No. 6, Nov. 1982, p. 2730.

Primary Examiner—Kenneth M. Schor
Assistant Examiner—Todd J. Burns
Attorney, Agent, or Firm—William H. Eilberg

[57] ABSTRACT

The present invention provides a method of forming a patterned silicone rubber layer on a surface of a workpiece such as a silicone wafer. According to the method, a polyimide film is first formed on the workpiece surface, and subsequently etched by lithography in a predetermined pattern. Then, a silicone rubber layer is formed on the workpiece surface over the patterned polyimide film by spin coating, and thereafter etched by plasma etching until the patterned polyimide film is exposed. Finally, the remaining polyimide film alone is completely etched away, so that the pattern previously given to the polyimide film is copied to the silicone rubber layer in a negative fashion.

9 Claims, 4 Drawing Sheets

METHOD OF FORMING PATTERNED SILICONE RUBBER LAYER

BACKGROUND OF THE INVENTION

1. Field of the Invention

This invention relates to a method of forming a patterned silicone rubber layer on a surface of a workpiece. More particularly, the invention relates to a method of forming a patterned silicone rubber layer as a protective and/or passivation layer for a silicon wafer surface.

2. Description of the Prior Art

In the field of electronic devices, silicone rubber is often used as a junction coating resin (JCR) for protecting the electronic devices mounted on a printed circuit board. In such an application, the silicone rubber is usually coated onto the circuit board by a potting method as is the case with applying an epoxy resin.

On the other hand, it has been recently found that, by properly adjusting the viscosity, the silicone rubber can be applied on a surface of a workpiece by a spin coating method. The spin coating method is known as a method for forming a uniform layer of a fluid resin on a workpiece surface, and therefore used widely in wafer process to form a photoresist layer on a silicon wafer surface for the purpose of lithography. The applicability of the spin coating method to the silicone rubber opens up the way for utilizing this material in wafer process for the production of semiconductor devices.

As one possibility of applications in wafer process, the silicone rubber may be spin-coated on a silicon wafer to form a uniform layer which works as a protective and/or passivation layer. In such an application, the silicone rubber layer need have windows or openings at the locations of conductor bonding pads to enable wire bonding. Further, the silicone rubber layer should have a sufficient thickness to provide an intended protecting or passivating function.

Then, a question arises how the silicone rubber layer can be patterned to have windows or openings while maintaining a sufficient thickness thereof. In fact, the silicone rubber is known to be chemically stable, so that a wet etching method using a chemical etching liquid cannot be adopted for this purpose. A dry or physical etching method such as the reactive sputter etching (reactive ion etching) is the only possibility. However, no resist material is currently available which provides a high etching selectivity in the dry etching method with respect to the silicone rubber. Further, the dry etching method provides a low etching rate relative to the silicone rubber, so that it is very difficult to form openings in a silicone rubber layer having a large thickness of e.g. 5-10 micrometers.

SUMMARY OF THE INVENTION

It is, therefore, an object of the present invention to provide a method of forming a patterned silicone rubber layer wherein the layer can be exactly patterned or opened even if it has a large thickness of 5-10 micrometers for example.

Another object of the present invention is to provide a method of forming patterned silicone rubber layer on a silicon wafer as one step of wafer process.

A further object of the present invention is to apply the inventive method to make a semiconductor device in which a formed silicone rubber layer is thick enough to provide an intended protective and/or passivation function.

According to the present invention, there is provided a method of forming a patterned silicone rubber layer comprising the steps of: forming a transient pattern forming layer on a surface of a workpiece; etching the transient layer in a predetermined pattern; forming a silicone rubber layer on the workpiece surface over the patterned transient layer; etching the silicone rubber layer until the patterned transient layer is exposed; and etching the patterned transient layer until the transient layer is completely removed.

According to the method described above, instead of directly etching a chemically stable silicone rubber layer into a predetermined pattern by using a patterned resist, a transient pattern forming layer such as a polyimide film is first formed on the workpiece surface, and thereafter etched in a predetermined pattern by utilizing easy etchability of the transient layer. The pattern given to the transient layer is then copied in negative fashion to a silicone rubber layer subsequently coated on the workpiece surface. For copying the pattern, the silicone rubber need be etched only to a degree of exposing the patterned transient layer which is subsequently removed completely by using a known etching liquid for example. Therefore, it is no longer necessary to etch the silicone rubber layer to the full depth thereof, thereby shortening the time required for pattern formation while maintaining a sufficient thickness of the silicone layer.

Preferably, the silicone rubber layer is formed by spin coating. This coating technique is advantageous in that provides a flat surface over the entire area of the silicone layer, so that the thickness of the silicone layer becomes smaller above the patterned transient layer than at the other locations of the workpiece surface. Therefore, the exposure of the patterned transient layer can be achieved within a short time by slight etching of the silicone layer.

Most advantageously, the method of the present invention may be used to form a silicone rubber layer on a silicon wafer surface as one step of wafer process. In this case, the silicone layer is patterned to have windows through which wires are connected to bonding pads of a conductor pattern.

Other objects, features and advantages of the present invention will be fully understood from the following detailed description given with reference to the accompanying drawings.

DETAILED DESCRIPTION OF THE PREFERRED EMBODIMENTS

Figure 2:
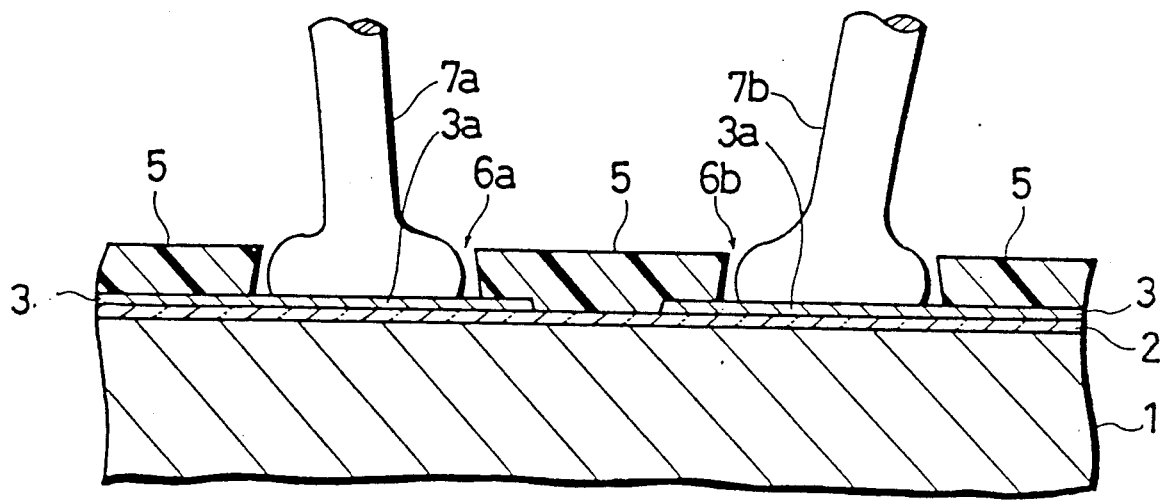
FIG. 2 is a view in section showing an example of semiconductor device made by the method of the present invention.

Referring now to FIG. 2 of the accompanying drawings, there is illustrated an example of semiconductor device which can be manufactured by utilizing a patterning method according to the present invention. The illustrated semiconductor device comprises a silicon wafer 1 coated with an insulating layer 2 of an oxide. An aluminum conductor pattern 3 having bonding pads 3a is formed on the insulating layer 2. A silicone rubber layer 5 is coated over the conductor pattern, but patterned to have windows 6 which enable the bonding pads 3a to be connected to wires 7.

The present invention provides a method for patterning the silicone rubber layer 5 to have the windows 6. Such a method is now described with reference to FIGS. 1a to 1e.

(1) Polyimide Film Forming Step

Figure 1A:
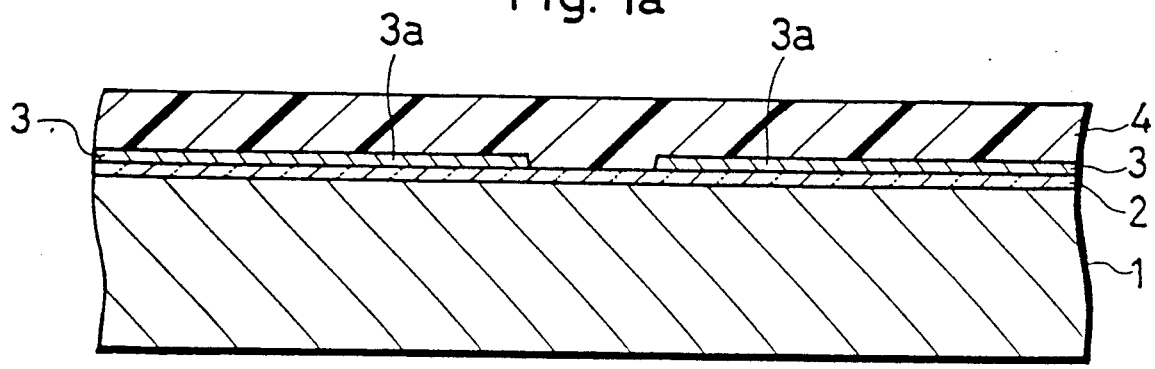
FIGS. 1a to 1e are views in section showing sequential steps of the method according to the present invention.

This step is started with a silicon wafer 1 which is formed thereon with an oxide layer 2 and a conductor pattern 3. In this step, the silicon wafer is entirely coated with a polyimide film 4, as shown in FIG. 1a. The polyimide film may be formed for example by spin coating wherein fluidized polyimide is supplied to the silicon wafer which is rotated at a high speed by a known spinner. The rotational speed of the wafer may be about 3,000–$\alpha$,000 rpm to provide a film thickness of about 10 micrometers although the speed may vary depending on the viscosity of the fluid material and the desired thickness of the film.

(2) Polyimide Film Patterning Step

Figure 1B:
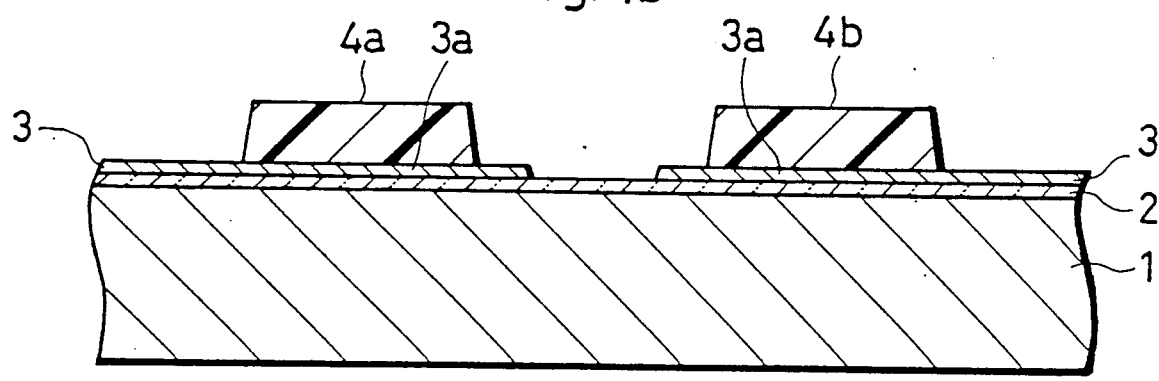

The polyimide film 4 thus formed is subjected to known lithography by using a positive resist (not shown) and a suitable mask (not shown). An alkaline solution may be used for development after which the polyimide film is etched by a known etching technique. As a result, unwanted portions of the film are removed to leave polyimide islands 4a on the bonding pads 3a, as shown in FIG. 1b. In a final substep, the remaining resist is removed by a known technique.

(3) Silicone Coating Step

Figure 1C:
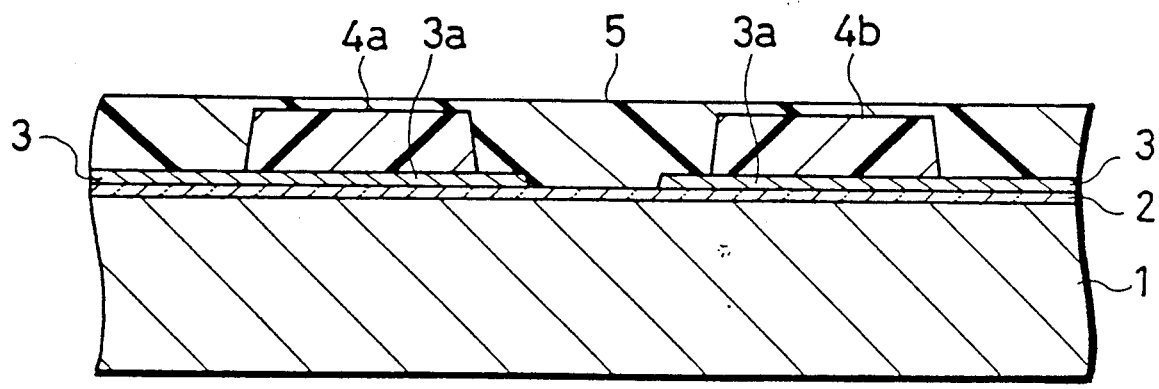

In this process step, the wafer is entirely coated with a uniform silicone rubber layer 5 by spin coating, as illustrated in FIG. 1c. During the spin coating, the wafer is rotated at a rotational speed of 4,000 rpm for example, so that the surface of the silicone layer lies 2-3 micrometers above the top surfaces of the polyimide islands 4a. The rotational speed of the wafer may be selected depending on the viscosity of the silicone fluid used and the desired thickness of the silicone layer.

(4) Silicone Layer Etching Step

Figure 1D:
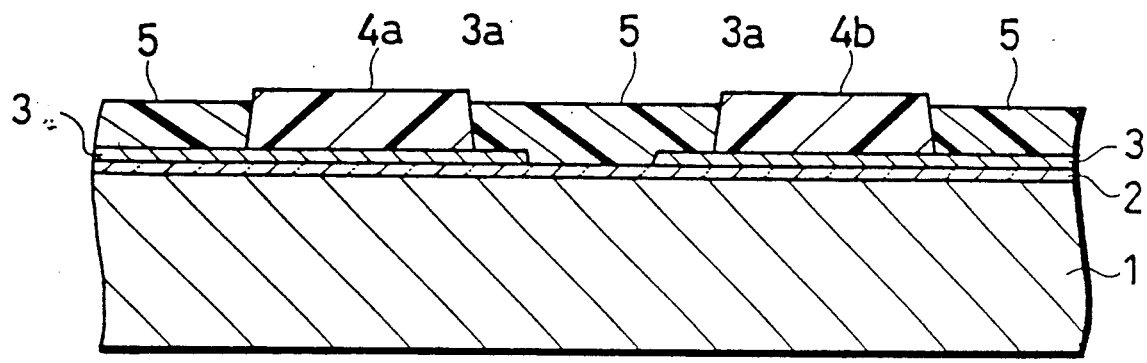
Figure 1E:
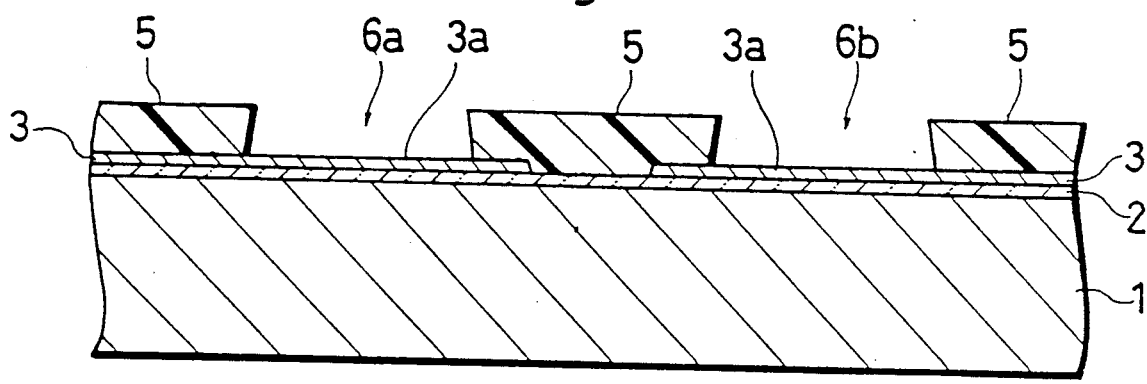

In this method step, the silicone layer 5 is uniformly etched over its entire surface by a known dry-etching technique until the polyimide islands 4a are slightly exposed, as shown in FIG. 1d. A suitable example of dry-etching is plasma etching using a fluoride gas (e.g. flon). During such dry-etching, the polyimide islands 4a are also etched slightly. However, the purpose of the silicone layer etching is to expose the polyimide islands, so that the simultaneous etching of the polyimide islands does not pose any problem as long as their exposure is achieved.

(5) Window Forming Step

In the final process step, the polyimide islands 4a are completely etched away to form windows 6 above the respective bonding pads 3a. The polyimide islands may be removed by a wet etching technique using a hydrazine containing etching liquid because this etching liquid selectively removes only the polyimide islands due to a large etching selectivity relative to polyimide and silicone.

To summarize the method described above, the polyimide film 4 is transiently formed on the wafer 1 and etched into a predetermined pattern. Subsequently, the silicone rubber layer 5 is uniformly formed on the wafer to lie over the remaining polyimide portions 4a and slightly etched to a degree of partially exposing the polyimide portions. Finally, the remaining polyimide portions are etched away to copy or transcribe the previous pattern (given to the polyimide film) onto the silicone layer in a negative fashion.

Conventionally, the chemical stability of silicone has prevented direct etching of a silicone layer to a sufficient depth in a predetermined pattern. For this reason, it has been considered impossible to completely etch the silicone layer in a desired pattern in case the silicone layer has a large thickness of 5-10 micrometers.

According to the present invention, on the other hand, a pattern is first given to the polyimide film 4 which can be more easily etched, and thereafter copied to the silicone layer 5 in a negative fashion. The silicone layer 5, which is chemically stable, need be etched only to a small degree of partially exposing the polyimide islands 4a even if the silicone layer has a large thickness of 5-10 micrometers as a whole. Therefore, this etching step can be conducted very easily within a short time. In copying the pattern previously given to the polyimide film, the chemical stability of the silicone layer is positively utilized for selectively etching the polyimide islands alone.

After patterning of the silicone rubber layer 5, the wires 7 may be bonded to the bonding pads 3a through the windows 6 to reach the arrangement shown in FIG. 2. Contrary to the conventional arrangement, there is no need to apply silicone rubber by potting after wire bonding because the silicone rubber layer 5 has been previously formed as one step of a wafer process.

Figure 3:
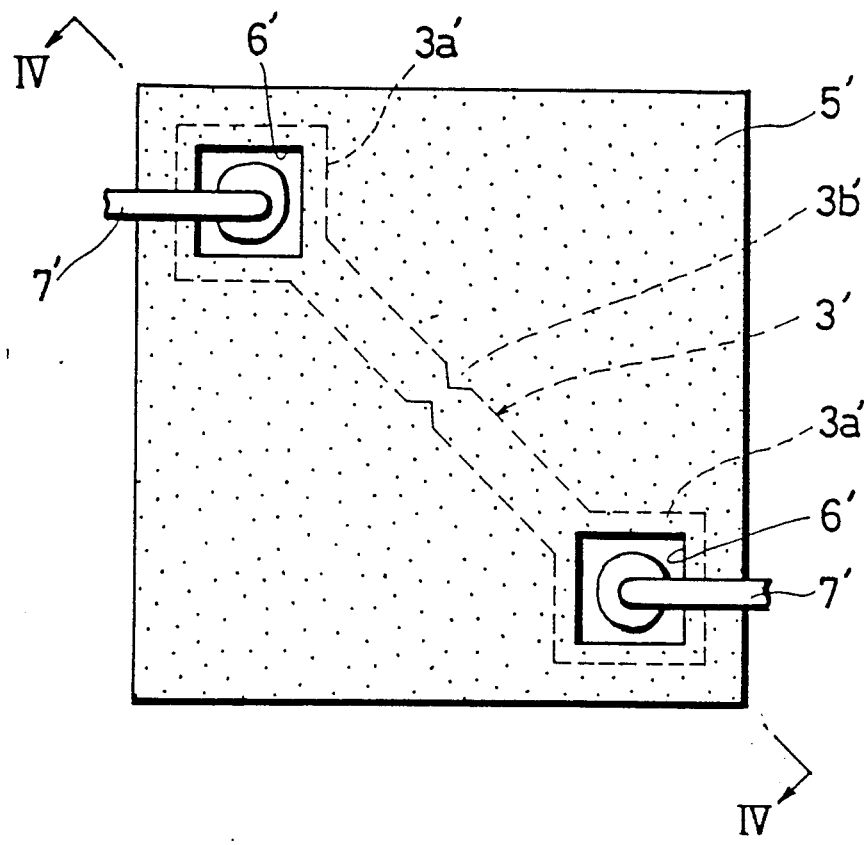
FIG. 3 is a plan view showing another example of semiconductor device made by the method of the present invention.
Figure 4:
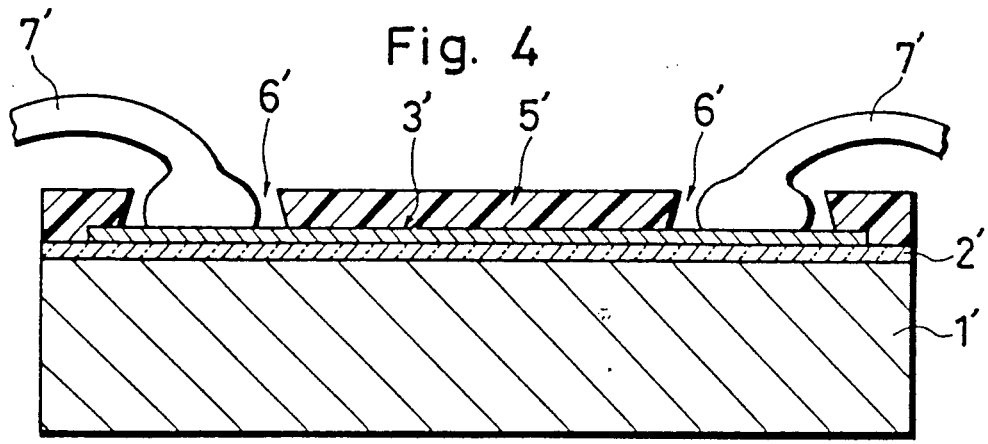
FIG. 4 is a sectional view taken on lines IV—IV in FIG. 3.

FIGS. 3 and 4 show a more specific example of semiconductor device which can be manufactured by utilizing the method of the present invention. This semiconductor device is a fuse which comprises a silicon wafer 1', an oxide insulating layer 2' formed on the wafer, and a aluminum conductor pattern 3' formed on the insulating layer to have a pair of bonding pads 3a' connected to wires 7'.

Further, the fuse is formed over its entire top surface with a silicone rubber layer 5' as a protective and/or passivation coating. The silicone rubber layer, which is formed by the same method as hereinbefore described, has windows 6' at the bonding pads 3a' of the conductor pattern 3'.

The conductor pattern 3' has a narrow portion 3b' which is melt-cut upon passage of a predetermined overcurrent. In order for the fuse to function properly, the melt-cut ends of the conductor must be separated enough to prevent current passage. If the protective coating lying on the conductor pattern is too hard as is the case with an epoxy resin, such a coating may prevent the melt-cut ends of the conductor from separating. The silicone rubber layer 5', because of its softness, allows immediate separation of the conductor melt-cut ends, thus ensuring proper functioning of the fuse.

Figure 5:
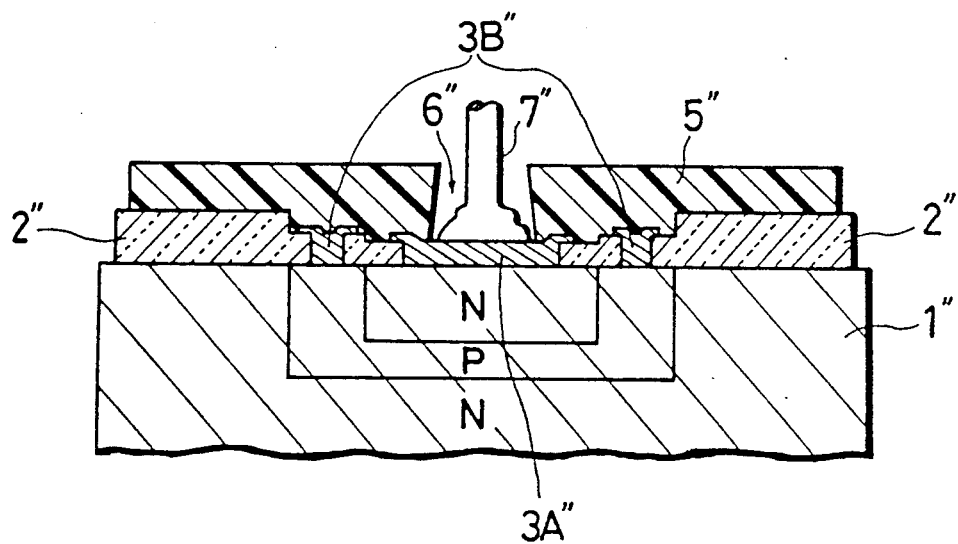
FIG. 5 is a sectional view showing still another example of semiconductor device made by the method of the present invention.

The present invention may also be applied to a transistor, as shown in FIG. 5. The illustrated transistor, which is an NPN transistor, includes a silicon wafer 1" which is rendered to have three different regions (two N regions and one P region) by impurity inclusion. The top surface of the wafer is coated with an oxide insulating layer 2" which is suitably etched to form an emitter electrode 3A" and a base electrode 3B" in conduction with relevant regions of the wafer. The top surface of the transistor is coated substantially entirely with a silicone rubber layer 5" which is applied by the same method as hereinbefore described.

In FIG. 5, the silicone rubber layer 5" is shown to have a window 6" for allowing a wire 7" to be bonded to the emitter electrode 3A". Though not shown in FIG. 5, the silicone layer is further formed at an unillustrated position with another window for bonding another wire to the base electrode 3B".

The present invention being thus described, it is obvious that the same may be varied in many ways. Such variations are not to be regarded as a departure from the spirit and scope of the invention, and all such modifications as would be obvious to those skilled in the art are intended to be included within the scope of the following claims.

I claim:

1. A method of forming a patterned silicone rubber layer comprising the sequential steps of:
    forming a polyimide layer on a surface of a workpiece,
    etching said polyimide layer in a predetermined pattern;
    forming a silicone rubber layer on said workpiece surface over said patterned polyimide layer and said workpiece by spin coating,
    etching said silicone rubber layer by plasma etching until said patterned polyimide layer is exposed, and
    etching said patterned polyimide layer by contacting said polyimide with a hydrazine containing etching liquid until said polyimide layer is completely removed, said hydrazine concentration being effective for etching polyimide to thereby provide a pattern formed of said silicone rubber layer on said workpiece.

2. The method as defined in claim 1, wherein the formation of said silicone rubber layer is performed until the surface of said silicone rubber layer lies 2–3 micrometers above the top surface of said patterned polyimide layer.

3. The method as defined in claim 1, wherein said plasma etching is performed by utilizing a fluoride gas as the etchant gas.

4. The method as defined in claim 1, wherein said polyimide layer is formed on said workpiece surface by spin coating.

5. The method as defined in claim 1, wherein said predetermined pattern is given to said polyimide layer by lithography.

6. A method of forming a patterned silicone rubber layer on a surface of a silicon wafer, said surface of silicon wafer being formed with a conductor pattern having bonding pads, said method comprising the sequential steps of:
    providing said silicon wafer having said conductor pattern and said bonding pads,
    forming polyimide islands on said bonding pads,
    forming a silicon rubber layer on said wafer surface over said wafer, said conductor pattern, said pads, and said polyimide islands by spin coating,
    etching said silicone rubber layer by plasma etching until said polyimide islands are exposed, and
    etching said polyimide islands by contacting said polyimide with a hydrazine containing etching liquid until said polyimide islands are completely removed, said hydrazine concentration being effective for etching polyimide so that windows are formed in said silicone rubber layer.

7. The method as defined in claim 6, wherein the formation of said silicone rubber layer is performed until the surface of said silicone rubber layer lies 2–3 micrometers above the top surfaces of said polyimide islands.

8. The method as defined in claim 6, wherein said plasma etching is performed by utilizing a fluoride gas as the etchant gas.

9. The method as defined in claim 6, wherein said polyimide islands are formed by first coating a polyimide layer on said wafer surface, said conductor pattern, and said bonding pads by spin coating, and subsequently patterning said polyimide layer by lithography.

* * * * *